(12) United States Patent
Bittner et al.

(10) Patent No.: US 9,661,740 B2
(45) Date of Patent: May 23, 2017

(54) ARRANGEMENT WITH A POWER SEMICONDUCTOR MODULE, HAVING A DC-VOLTAGE BUSBAR AND A CAPACITOR

(71) Applicant: Semikron Elektronik GmbH & Co., KG, Nürnberg (DE)

(72) Inventors: Roland Bittner, Stegaurach (DE); Marco Lederer, Nürnberg (DE); Sven Teuber, Winkelhaid (DE); Matthias Spang, Stein (DE)

(73) Assignee: Semikron Elektronik GmbH & Co., KG, Nürnberg (DE)

( * ) Notice: Subject to any disclaimer, the term of this patent is extended or adjusted under 35 U.S.C. 154(b) by 0 days.

(21) Appl. No.: 14/881,325

(22) Filed: Oct. 13, 2015

(65) Prior Publication Data

US 2016/0234926 A1    Aug. 11, 2016

(30) Foreign Application Priority Data

Oct. 13, 2014    (DE) .................... 10 2014 114 828

(51) Int. Cl.
*H05K 7/00* (2006.01)
*H05K 1/02* (2006.01)
(Continued)

(52) U.S. Cl.
CPC ............ *H05K 1/025* (2013.01); *H01L 23/48* (2013.01); *H01L 23/642* (2013.01);
(Continued)

(58) Field of Classification Search
CPC .......... H05K 1/025; H05K 7/026; H05K 7/12; H05K 2201/10015; H01L 2924/19041;
(Continued)

(56) References Cited

U.S. PATENT DOCUMENTS 6,262,876 B1    7/2001    Schimanek
9,351,423 B2    5/2016    Ishino
(Continued)

FOREIGN PATENT DOCUMENTS

DE    10 2007 026 768 A1    12/2008
DE    10 2012 201 766 A1    8/2013
(Continued)

*Primary Examiner* — Hung S Bui
(74) *Attorney, Agent, or Firm* — The Law Offices of Roger S. Thompson

(57) ABSTRACT

An arrangement comprising a power semiconductor module, a capacitor, a DC-voltage busbar and a connection device. The module has two flat DC-voltage connection conductors each having a contact section. The DC-voltage connection conductors are arranged closely adjacent to one another on and close to the respective contact sections in the normal direction. The capacitor has two flat capacitor connection conductors each having a contact section. The DC-voltage busbar has two partial busbars each having a contact section. The connection device has a yoke with a die and a bearing. The respective contact sections of the DC-voltage connection conductors are clamped flat above one another between the die and the bearing. The contact sections, of the capacitor or the DC-voltage busbar, are arranged closely adjacent to one another on and close to the respective contact sections in the normal direction, and are thus force-fittingly and electrically conductively connected to one another.

14 Claims, 5 Drawing Sheets

(51) Int. Cl.
  *H01L 23/48* (2006.01)
  *H02M 7/00* (2006.01)
  *H05K 7/02* (2006.01)
  *H05K 7/12* (2006.01)
  *H01L 23/64* (2006.01)
  *H01L 25/07* (2006.01)

(52) U.S. Cl.
  CPC ............ *H02M 7/003* (2013.01); *H05K 7/026* (2013.01); *H05K 7/12* (2013.01); *H01L 25/072* (2013.01); *H01L 2924/0002* (2013.01); *H01L 2924/19041* (2013.01); *H05K 2201/10015* (2013.01)

(58) Field of Classification Search
  CPC ........... H01L 2924/0002; H01L 25/072; H01L 23/48; H01L 23/642; H02M 7/003
  USPC ....... 361/502, 738, 734, 762, 782, 794, 811, 361/820, 821
  See application file for complete search history.

(56) References Cited

U.S. PATENT DOCUMENTS

| | | | | |
|---|---|---|---|---|
| 2008/0130223 | A1* | 6/2008 | Nakamura | H02M 7/003 361/689 |
| 2013/0039103 | A1* | 2/2013 | Smolenski | H02M 7/003 363/123 |
| 2015/0296653 | A1* | 10/2015 | Mathieu | H05K 7/20918 361/690 |
| 2017/0025806 | A1* | 1/2017 | Bittner | H01R 13/621 |
| 2017/0055366 | A1* | 2/2017 | Backhaus | H05K 7/2089 |

FOREIGN PATENT DOCUMENTS

| | | |
|---|---|---|
| EP | 0 994 494 A1 | 4/2000 |
| EP | 2 343 780 A1 | 7/2011 |
| JP | 201411339 A | 1/2014 |

* cited by examiner

Fig. 8A
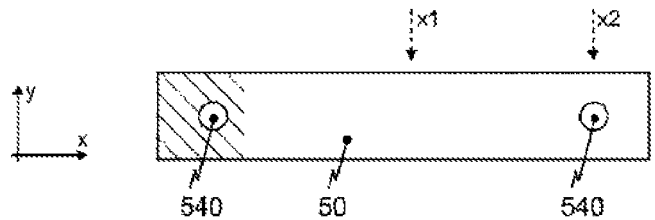
Fig. 8B
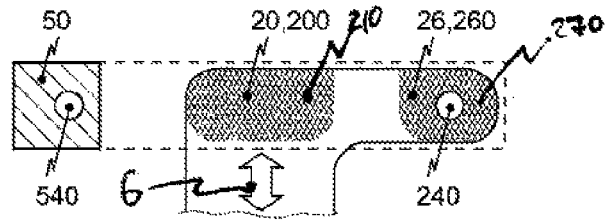
Fig. 8C
Fig. 8D
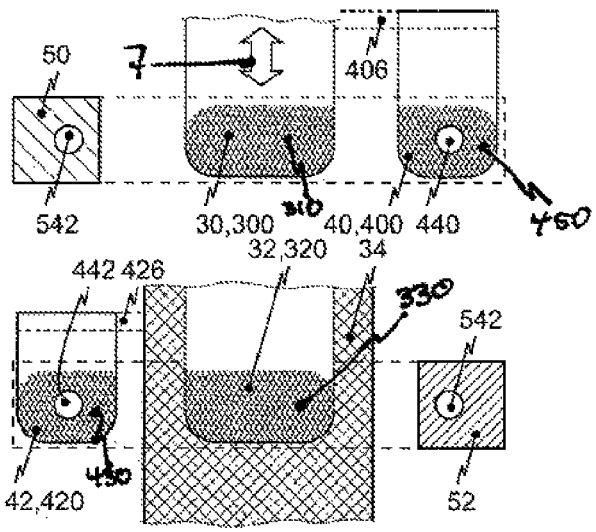
Fig. 8E
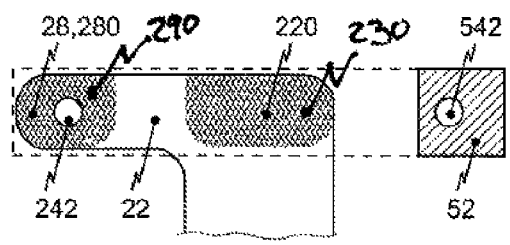
Fig. 8F
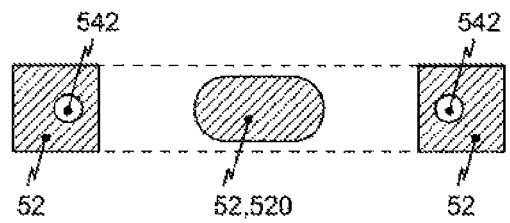

_(1)_

ARRANGEMENT WITH A POWER SEMICONDUCTOR MODULE, HAVING A DC-VOLTAGE BUSBAR AND A CAPACITOR

BACKGROUND OF THE INVENTION

1. Field of the Invention

The invention is directed to an arrangement having a power semiconductor module, a DC-voltage busbar and a capacitor device as may be arranged in power-electronic systems which are used, by way of example, in vehicles, for actuating and supplying electrical machines as main or auxiliary drives.

2. Description of the Related Art

A power-electronic system having a multi-part housing with at least one cover and a frame-like housing part is known from German Patent Application No. DE 2012 201 766 A1. The system disclosed therein has connection devices, an internal DC-voltage busbar, a power-electronic circuit arrangement in the form of one or more power semiconductor modules and a capacitor device covered with a first cover. Power semiconductor devices for such systems are known by way of example from German Patent Application No. DE 2007 026 768 A1. That document describes a pressure-contact-connected three-phase current converter module having one substrate with power semiconductor components per phase, having a housing, a pressure element and load-connection and auxiliary-connection elements leading outwards. The respective substrate consists of an insulating-material body and conductor tracks with load and auxiliary potentials. The load-connection elements are each formed as molded metal bodies with external contact devices to a strip-like section and with contact feet arranged in three rows starting from the strip-like section.

Such arrangements or systems require a low-inductance configuration of the power semiconductor module itself and also the further current conduction in the DC-voltage busbar and in the connection to the capacitor device.

SUMMARY OF THE INVENTION

It is an object of the invention to provide an improved configuration of the connections of a power semiconductor module in an arrangement and in at least one of the DC-voltage busbar and capacitor device connected thereto, preferably both, in particular to design them to be low-inductance, that is to say having a relatively low parasitic inductance.

The inventive arrangement includes a power semiconductor module having first and second DC-voltage connection conductors. Each of the DC-voltage connection conductors is flat, has a respective contact section, and is arranged closely adjacent to another one of the CD-voltage connection connectors, at least in the region on and close to the respective contact sections in the direction of a respective normal vector thereof.

The power semiconductor module further includes a capacitor device having first and second capacitor connection conductors. Each of the capacitor connection conductors is flat and has a respective contact section.

The power semiconductor module also includes: a DC-voltage busbar having first and second partial busbars, each of partial busbars having a respective contact section; and a connection device having a yoke with a die and an assigned opposing bearing.

The respective contact sections of the DC-voltage connection conductors are clamped in the normal direction one above the other between the die and the opposing bearing with the contact sections, which are assigned in a manner suitable for connection of at least one of the capacitor device and the DC-voltage busbar, which are arranged closely adjacent to one another at least in the region on and close to the respective contact sections in the direction of the respective normal vector thereof there, and are thus electrically conductively connected to one another in a force-fitting manner.

When discussing electrical conductors, the term "assigned" should be understood in the present document to mean "having the same polarity", unless explicitly stated otherwise.

The term "closely adjacent" should be understood in the present document to mean "at a short distance", wherein the short distance is either sufficient per se to ensure electrical insulation of the region in between, or an insulating means, for example a plastic film, is arranged in between for the purpose of insulation. In other words, a "short distance" means a sufficient distance to ensure electrical insulation in the case of different polarities.

"Contact section" should be understood in the present document to mean in each case that region of a connection conductor or a contact rail which produces a direct flat electrically conductive connection of the two connection conductors by means of the contact sections on a contact surface in contact with an assigned contact surface of another connection conductor or a contact rail.

Of course, the features mentioned in the singular, in particular the power semiconductor module and the capacitor device, may also be present in the plural in the arrangement according to the invention, provided this is not excluded per se.

It may be advantageous for the proposed arrangement if the introduction of pressure into the connection device is implemented by means of a screw connection between the yoke and the opposing bearing.

In a preferred configuration of the arrangement, the DC-voltage connection conductors are designed such that they each have a fastening section which projects laterally away from the contact section and hence is not located in the main flow direction of the current. In this connection, it is essential that the cross section of the current conductor in the main flow direction of the current is not reduced by said fastening section. Such a reduction would entail an increase in the nonreactive resistance and hence undesirable local heating.

The "main flow direction of current" should be understood to mean that flow direction of the current which contributes predominantly to the occurrence of parasitic inductance.

Furthermore, it may be advantageous if the screw connection between the yoke and the opposing bearing reaches through a cutout of an assigned fastening section.

In principle, it is preferred if the opposing bearing is part of the power semiconductor module or part of the capacitor device. It may likewise be advantageous if the yoke is part of the power semiconductor module or part of the capacitor device or an assembly independent thereof. It is particularly preferred if the opposing bearing and the yoke are parts of the same assembly, that is to say the power semiconductor module or the capacitor device.

In particular embodiments, the die may be elastically connected to the yoke. Likewise, an additional clamping device may be provided for the die, which has either an additional screw or an elastic section or both.

It is particularly advantageous if the DC-voltage busbar, in the event that it is not electrically conductively connected to the power semiconductor module, has first and second partial busbars which are arranged closely adjacent to one another in the region close to the respective contact sections in the direction of the respective normal vector thereof there, and the respective contact sections thereof are force-fittingly and electrically conductively connected by means of the yoke to the associated fastening sections, which thus form further contact sections, of the assigned DC-voltage connection conductors.

Alternatively, it is also particularly advantageous if the capacitor device, in the event that it is not electrically conductively connected to the power semiconductor module, has capacitor connection conductors which are arranged closely adjacent to one another in the region close to the respective contact sections in the direction of the respective normal vector thereof there, and the respective contact sections thereof are force-fittingly and electrically conductively connected by means of the yoke to the associated fastening sections, which thus form further contact sections, of the assigned DC-voltage connection conductors.

The configuration which is most advantageous in terms of all of its properties is where the DC-voltage connection conductors of the power semiconductor module and the capacitor connection conductors of the capacitor device lie flat one on top of the other in the configuration according to the invention and thus form a stack, because those currents with the largest temporal changes flow between said connection conductors during operation. These temporal changes are, together with the areas spanned by the connection conductor and through which the current flows, the significant input variables for the parasitic inductances occurring during operation. The magnitudes of the parasitic inductances determine the dynamic performance of the arrangement during operation. The connection device is in this most advantageous configuration connected by means of the fastening sections to the power semiconductor module and the capacitor device. This is sufficient since the currents in the connection device are not subject to such large temporal changes.

Further explanations of the invention, advantageous details and features emerge from the following description of the exemplary embodiments of the invention which are schematically illustrated in FIGS. 1 to 8 or from respective parts thereof.

Other objects and features of the present invention will become apparent from the following detailed description of the presently preferred embodiments, considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

In the drawings:

FIGS. 8A-F show various successive sections (xy plane) through the first arrangement according to the invention.

DETAILED DESCRIPTION OF THE PRESENTLY PREFERRED EMBODIMENTS

Figure 1:
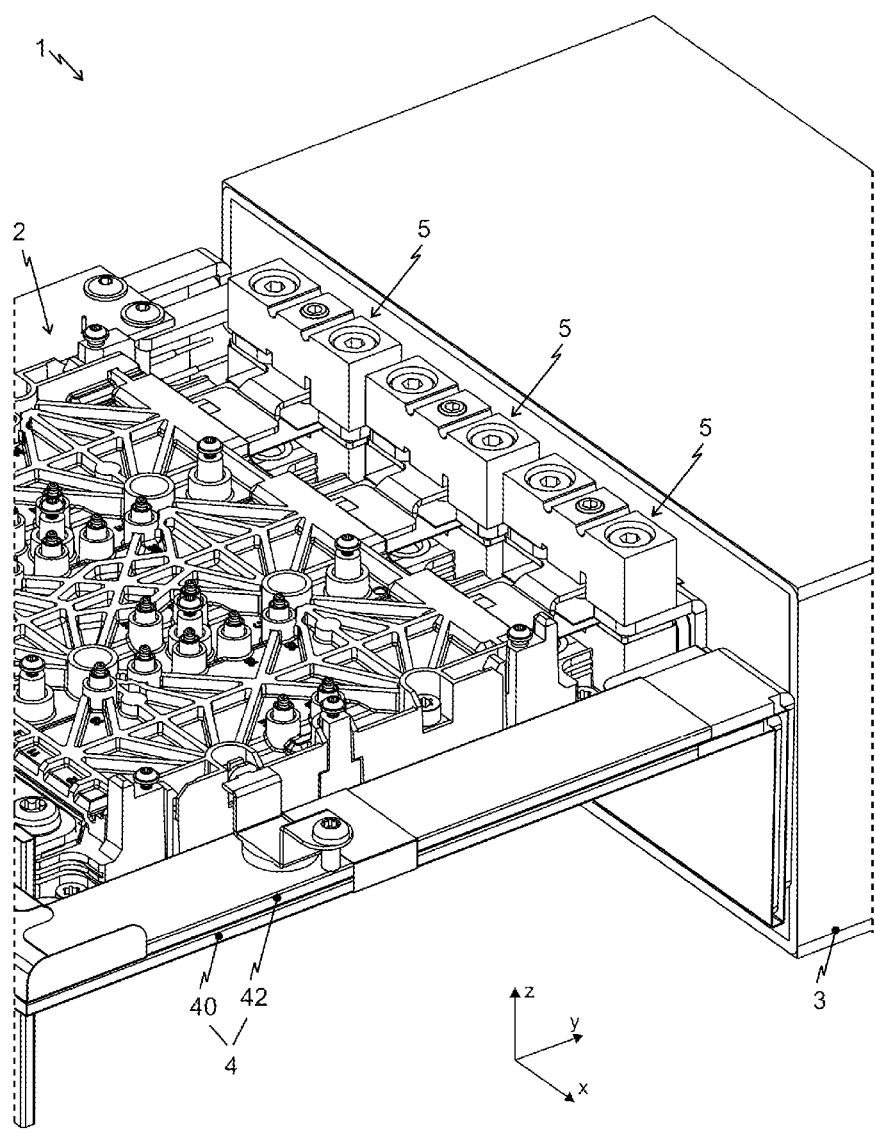
FIGS. 1 to 3 show a three-dimensional view of various sections or partial sections of a first arrangement according to the invention.
Figure 2:
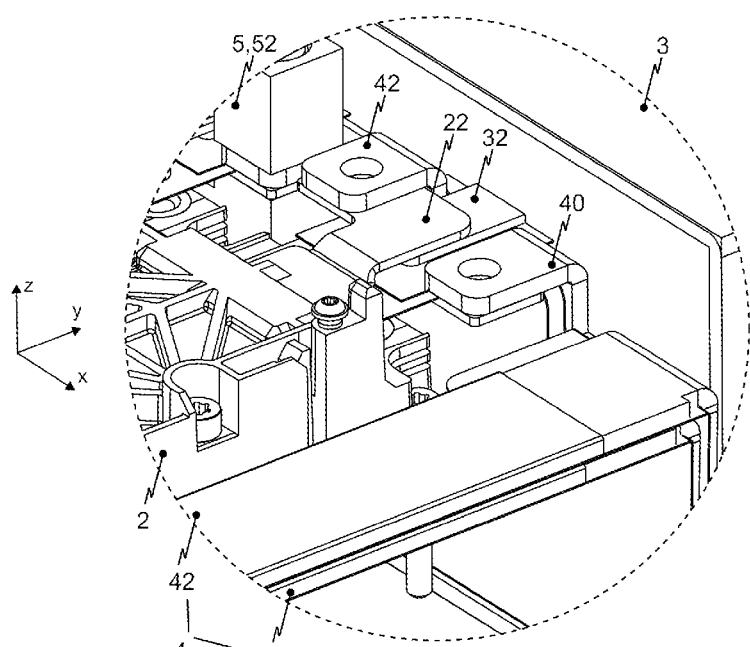
Figure 3:
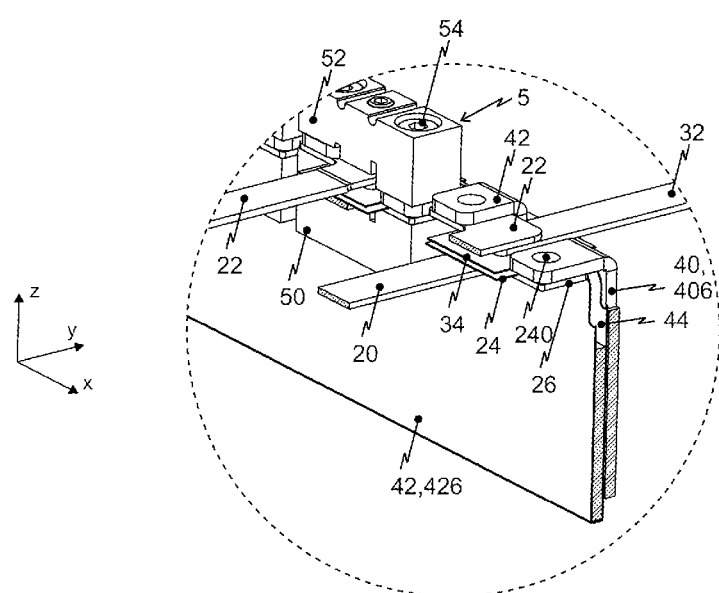
Figure 4:
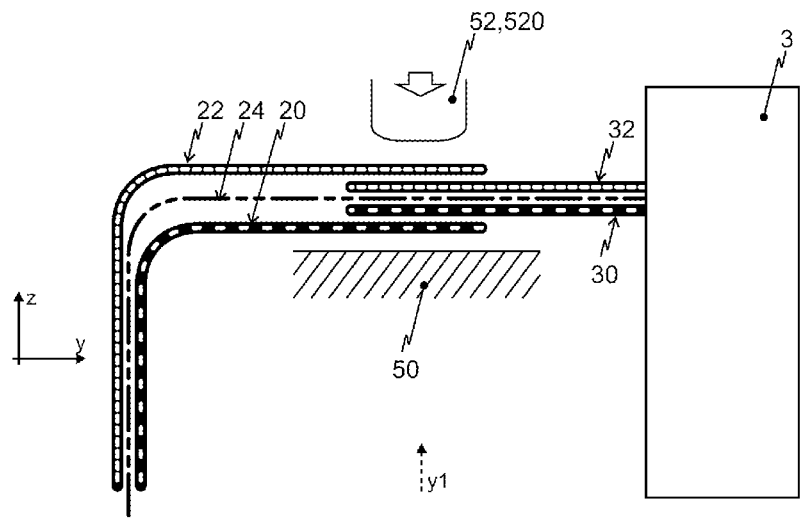
FIG. 4 schematically shows a section (yz plane) through the first arrangement according to the invention.

FIGS. 1 to 3 show, in each case in three-dimensional view, a first arrangement according to the invention or parts thereof. FIG. 4 schematically shows a section (yz plane) through said first arrangement according to the invention. For many of the details which are not visible in FIGS. 1 to 4, cf. FIG. 8 in each case.

The inventive arrangement has a three-phase power semiconductor module 2, a capacitor device 3 and a DC-voltage busbar 4. Power semiconductor module 2 has first and second generally flat DC-voltage connection conductors 20, 22 per alternating-current phase, which DC-voltage connection conductors 20, 22 each terminate with a respective contact section 200, 220. In addition, DC-voltage connection conductors 20, 22 have fastening sections 26, 28 projecting laterally from contact sections 200, 220. DC-voltage connection conductors 20, 22 run inside power semiconductor module 2 to contact sections 200, 220 and said contact sections 200, 220 are arranged in sections closely adjacent to one another including in the direction of the normal vector thereof, cf. also FIG. 4. An insulating-material body, in this case an insulating-material film 24 conventional in the art, is disposed between first and second DC-voltage connection conductors 20, 22 for the purpose of electrical insulation. First DC-voltage connection conductor 20 has a first polarity, in this case "positive", while second DC-voltage connection conductor 22 has a second polarity, in this case "negative".

Capacitor device 3 has first and second capacitor connection conductors 30, 32, wherein these are each generally flat and from the housing of capacitor device 3 to contact sections 300, 320 thereof and are arranged closely adjacent to one another including in the direction of the normal vector thereof, cf. also FIG. 4. An insulating-material body, in this case an insulating-material film 34 conventional in the art, is arranged between first and second capacitor connection conductor 30, 32 for the purpose of electrical insulation. Insulating-material body 34 can be formed integrally with insulating-material body 24 of DC-voltage connection conductor 20, 22, cf. FIG. 4.

DC-voltage busbar 4 is used, in particular, to connect capacitor device 3 to an external DC-voltage source and is not illustrated in FIG. 4 for reasons of clarity. DC-voltage busbar 4 has first and second partial busbars 40, 42, wherein these in turn respectively have a plurality of generally flat sections 406, 426 which are arranged closely adjacent to one another in the direction of the normal vector thereof. Likewise, DC-voltage busbar 4 has an insulating-material body, in this case again an insulating-material film 44, which is used for electrical insulation of first partial busbar 40 with respect to second partial busbar 42. Contact sections 400, 420 of partial busbars 40, 42 are not closely adjacent in the sense mentioned above; rather, they are arranged laterally next to one another and in electrically conductive contact with fastening sections 26, 28 of DC-voltage connection conductors 20, 22, which form additional contact sections 260, 280 here.

The inventive arrangement also has a connection device 5. In this case, this has an opposing bearing 50 which is designed as part of a housing of power semiconductor module 2. In this case, the first DC-voltage connection conductor of power semiconductor module 2 is on opposing bearing 50. First capacitor connection conductor 30, an insulating-material film 24, 34, second capacitor connection conductor 32 and second DC-voltage connection conductor 22 or respective contact sections 200, 220, 300, 320 thereof then follow in a stack-like arrangement. A die 520 of a yoke 52 of connection device 5 then follows in alignment with said stack. Die 520 generates a pressure on said stack, which is supported against opposing bearing 50 and thus presses assigned contact sections 200, 220, 300, 320 against one another such that in each case an extensive, that is to say not only patchy, electrically conductive connection is produced. For this purpose, yoke 52 is screwed by means of two screws 54 onto the housing of power semiconductor module 2 with integrated opposing bearing 50. Screws 54 penetrate, in respective cutouts 440, 442, 240, 242, contact sections 400, 420 of partial busbars 40, 42 of DC-voltage busbar 4 and fastening sections 26, 28 of DC-voltage connection conductor 20, 22 of power semiconductor module 2. Partial busbars 40, 42 of DC-voltage busbar 4 are simultaneously electrically conductively connected to DC-voltage connection conductors 20, 22 herewith and hence also to capacitor device 3 by means of the force-fitting electrically conductive connection of DC-voltage connection conductors 20, 22 and capacitor connection conductors 30, 32.

Figure 5:
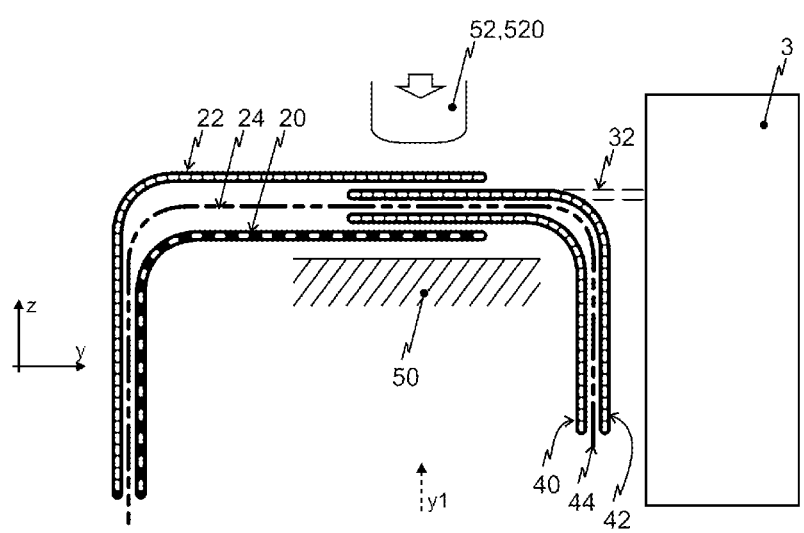
FIG. 5 schematically shows a section (yz plane) through a second arrangement according to the invention.

FIG. 5 schematically shows a section (yz plane) through a second arrangement according to the invention. Again, first and second DC-voltage connection conductors 20, 22 of a power semiconductor module 2, a capacitor device 3, a DC-voltage busbar 4 and a connection device 5 are illustrated. In contrast to the configuration of the first arrangement, in particular according to the illustration in FIG. 4, DC-voltage connection conductors 20, 22 with their respective first and second contact sections 200, 220 and DC-voltage busbar 4 with its respective first and second contact section 400, 420 of partial busbars 40, 42, which are arranged and designed to be closely adjacent to one another in the normal direction here, form a stack. Capacitor connection conductors 30, 32 are connected to fastening sections 26, 28, forming further contact sections 260, 280, of DC-voltage connection conductors 20, 22. The design of connection device 5 is identical to that according to FIG. 4. In this case, too, an insulating-material film 44 is arranged between partial busbars 40, 42 of DC-voltage busbar 4.

Figure 6:
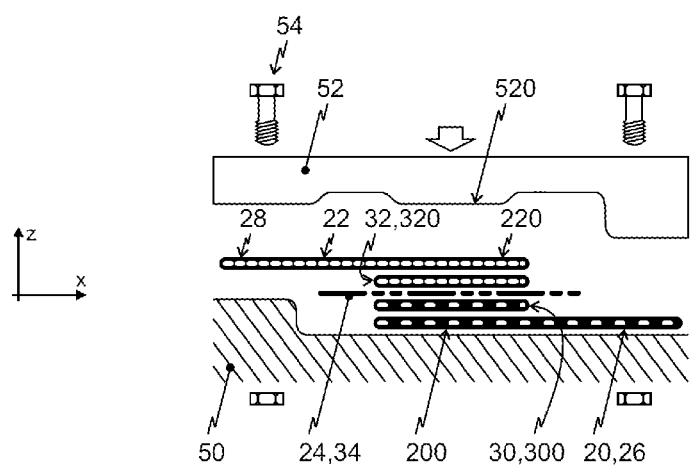
FIG. 6 schematically shows a section (xz plane) through another arrangement according to the invention.

FIG. 6 schematically shows a section (xz plane) through another, simplified arrangement according to the invention. In this connection, only the electrical connection between a power semiconductor module 2 and a capacitor device 3 is illustrated. First and second DC-voltage connection conductors 20, 22 of power semiconductor module 2 each have a contact section 200, 220 and a fastening section 26, 28. First and second capacitor connection conductors 30, 32 likewise each have a contact section 300, 320. An insulating-material film 24 is arranged between the first and second connection conductor 20, 22 for the electrical insulation thereof.

Figure 7:
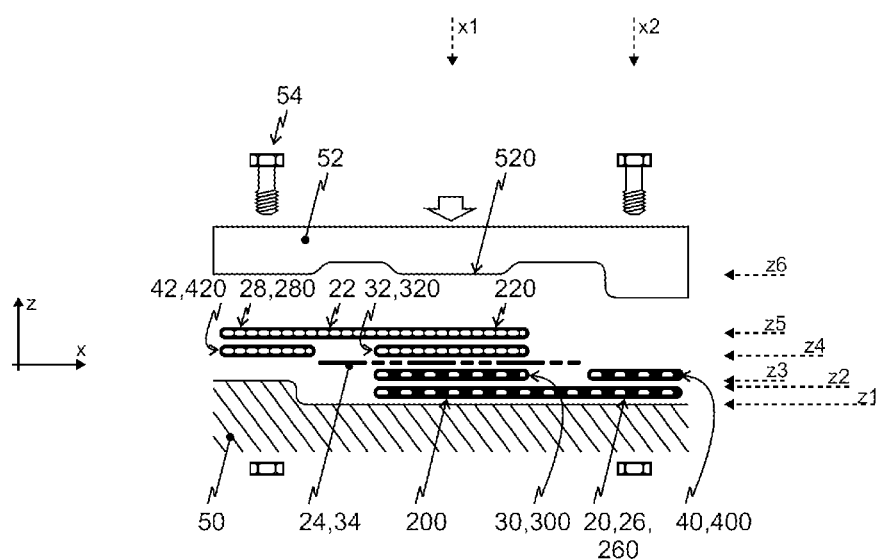
FIG. 7 schematically shows a section (xz plane) through the first arrangement according to the invention.

Connection device 5 has an opposing bearing 50, a yoke 52 with a die 520 and two screws 54 for introducing pressure. Die 520 presses the stack composed of first contact devices 200, 300, insulating-material film 24, 34 and second contact devices 220, 320 onto opposing bearing 50 and thus produces a force-fittingly electrically conductive connection of the respective first and second contact sections. FIG. 7 schematically shows a section (xz plane) through the first arrangement according to the invention. This is designed in a manner similar to the second arrangement, illustrated in FIG. 6. However, it has another third connection partner, namely DC-voltage busbar 4. This has, as already described above, first and second partial busbars 40, 42, wherein partial busbars 40, 42 each have contact devices 400, 420 which are connected to further contact sections 260, 280 formed on fastening sections 26, 28 of DC-voltage connection conductors 20, 22. For this purpose, both fastening sections 26, 28 and contact sections 400, 420 of partial busbars 40, 42 have cutouts through which the screws of screw connection 54 of connection device 5 reach. FIGS. 8A-F schematically show various successive sections (xy plane) through the first arrangement according to the invention. Said sections of FIGS. 8A) to 8F) correspond to the z planes z1 to z6 of FIG. 7. Apart from that, such section planes x1, x2 and y1 in the respective figures correspond to one another.

FIG. 8A) shows a plane z1 in which the surface of opposing bearing 50 and a section through an elevation of opposing bearing 50, on the left in FIG. 7, are illustrated. Furthermore, opposing bearing 50 has cutouts 540 for screw connection 54 for introducing pressure to connection device 5. FIG. 8B) shows a plane z2 in which the elevation is also illustrated like first DC-voltage connection conductor 20 of power semiconductor module 2. First DC-voltage connection conductor 20 has a contact section 200 with a contact surface 210 (shown in diamond-shaped shading), cf. FIG. 8c). Furthermore, first DC-voltage connection conductor 20 has a fastening section 26 which has a further contact section 260 with likewise shaded contact surface 270. The main flow direction of current from power semiconductor module 2 to capacitor device 3 and back is also illustrated using a double-headed arrow 6. It can clearly be seen that fastening section 26 has no effect on the cross section of the current conductor from and to capacitor device 3. Fastening section 26 has a cutout 240, aligned with the assigned cutout 540 of opposing bearing 50, for feeding-through a screw for screw connection 54 of connection device 5.

FIG. 8C) shows a plane z3 in which the elevation is again visible. First contact section 300 of first capacitor connection conductor 30 with assigned contact surface 310 is also located in this plane, wherein contact surface 310 corresponds to contact surface 210 of first DC-voltage connection conductor 20 in FIG. 8B) and represents that region in which the current flows (see, double-headed arrow 7) from first DC-voltage connection conductor 20 into first capacitor connection conductor 30. Furthermore, first contact section 400 of first partial busbar 40 of DC-voltage busbar 4 is located in this plane. Contact surface 450 corresponds to further contact surface 270 of fastening section 26 of first DC-voltage connection conductor 20 of power semiconductor module 2. Contact section 400 additionally has a cutout 440 aligned with cutout 240 of assigned fastening section 26. Furthermore, a flat section 406 of first partial busbar 40 which adjoins contact section 400 is illustrated.

FIG. 8D) shows a plane z4 in which the contact section of the second partial busbar 42 of DC-voltage busbar 4 lies on the elevation which is no longer visible. Second partial busbar 42 has a flat section 426 which is arranged closely adjacent to that section 406 of first partial busbar 40 according to FIG. 8C) in the normal direction. Contact section 420 also has a contact surface 430 for electrical connection to a contact surface 290 of further contact section 280 of second DC-voltage connection conductor 22 of power semiconductor module 2. Likewise, contact section 420 has a cutout 442 aligned with the cutout 540 of the elevation of opposing bearing 50. What is also illustrated is an insulating-material film 34 lying below plane z4 and a second capacitor connection conductor 32, arranged in plane z4 and on insulating-material film 34, with a contact section 320 and a contact surface 330. What is likewise illustrated is a first foot of yoke 52, which foot has a cutout 542 which aligns with corresponding cutouts 540, in particular that of opposing bearing 50.

FIG. 8E) shows a plane z5 in which the first foot of yoke 52 can also be seen. What is likewise illustrated is second DC-voltage connection conductor 22 with a contact section 220 with contact surface 230 for electrical connection to corresponding contact surface 330 of contact section 320 of second capacitor connection conductor 32. Second DC-voltage connection conductor 22 has another contact section 280 formed from fastening section 28, which has a contact surface 290 for electrical contact with the corresponding contact surface of contact section 420 of second partial busbar 42 of DC-voltage busbar 4. Of course, fastening section 28 again has the necessary cutout 242, which aligns, in particular, with assigned cutout 540 of opposing bearing 50.

FIG. 8F) shows a plane z6 in which the feet of yoke 52 are illustrated in each case laterally with cutouts 52 4 thereof aligning with assigned cutouts 540 of opposing bearing 50. Die 520 of yoke 52 is arranged between said feet and, after the introduction of pressure by means of screw connection 54 reaching through respective cutouts 540, 542, produces the force-fitting electrically conductive connection between the contact surfaces and hence contact sections 200, 300 of first DC-voltage connection conductor 20 and first capacitor connection conductor 30 or between contact surfaces 230, 330 and hence contact sections 220, 320 of second capacitor connection conductor 32.

It goes without saying that the various configurations of the invention may be implemented individually or in any combination in order to achieve improvements. In particular, the above-mentioned features which are explained here or below can be used not only in the specified combination but also in other combinations which are not mutually exclusive or on their own without departing from the scope of the invention.

In the preceding Detailed Description, reference was made to the accompanying drawings, which form a part of this disclosure, and in which are shown illustrative specific embodiments of the invention. In this regard, directional terminology, such as "top", "bottom", "left", "right", "front", "back", etc., is used with reference to the orientation of the figure(s) with which such terms are used. Because components of embodiments can be positioned in a number of different orientations, the directional terminology is used for purposes of ease of understanding and illustration only and is not to be considered limiting.

Additionally, while there have been shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. An arrangement comprising:
   a power semiconductor module having first and second DC-voltage connection conductors, each of said DC-voltage connection conductors being generally flat and having a respective contact section, said DC-voltage connection conductors being arranged closely adjacent to one another at least in the region on and close to said respective contact sections in the direction of a respective normal vector thereof;
   a capacitor device having first and second capacitor connection conductors, each of said capacitor connection conductors being generally flat and having a respective contact section;
   a DC-voltage busbar having first and second partial busbars, each of said partial busbars having a respective contact section; and
   a connection device having a yoke with a die and an assigned opposing bearing;
   wherein said respective contact sections of said DC-voltage connection conductors are clamped in the normal direction one above the other between said die and said opposing bearing with said contact sections, which are assigned in a manner suitable for connection of at least one of said capacitor device and said DC-voltage busbar, which are arranged closely adjacent to one another at least in the region on and close to the respective contact sections in the direction of the respective normal vector thereof there, and are thus electrically conductively connected to one another in a force-fitting manner.

2. The arrangement of claim 1, further comprising a screw connection between said yoke and said opposing bearing for introducing pressure into onto said connection device.

3. The arrangement of claim 2, wherein said DC-voltage connection conductors each have a fastening section which projects laterally away from said contact section and hence is not located in a main current flow direction.

4. The arrangement of claim 3, wherein said fastening section includes a cutout and said screw connection reaches through said cutout.

5. The arrangement of claim 1, wherein said DC-voltage connection conductors each have a fastening section which projects laterally away from said contact section and hence is not located in a main current flow direction.

6. The arrangement of claim 5, wherein said fastening section includes a cutout and said screw connection reaches through said cutout.

7. The arrangement of claim 1, wherein said opposing bearing is part of said power semiconductor module.

8. The arrangement of claim 1, wherein said opposing bearing is part of said capacitor device.

9. The arrangement of claim 1, wherein said yoke is part of said power semiconductor module.

10. The arrangement of claim 1, wherein said yoke is part of said capacitor device.

11. The arrangement of claim 1, wherein said yoke is part of an assembly independent of said capacitor device.

12. The arrangement of claim 1, wherein said die is elastically connected to said yoke.

13. The arrangement of claim 3,
wherein said DC-voltage busbar, is not electrically conductively connected to said power semiconductor module; and
wherein said first and second partial busbars are arranged closely adjacent to one another in the region close to the respective contact sections thereof in the direction of the respective normal vector thereof there, and said respective contact sections thereof are force-fittingly and electrically conductively connected by means of said yoke to said associated fastening sections, which thus form further contact sections, of the assigned DC-voltage connection conductors.

14. The arrangement of claim 3,
wherein said capacitor device is not electrically conductively connected to said power semiconductor module; and
wherein said first and second capacitor connection conductors are arranged closely adjacent to one another in the region close to the respective contact sections thereof in the direction of the respective normal vector thereof there, and said respective contact sections thereof are force-fittingly and electrically conductively connected by means of said yoke to said associated fastening sections, which thus form further contact sections, of the assigned DC-voltage connection conductors.

* * * * *